United States Patent
Kellam et al.

(10) Patent No.: US 9,305,644 B2
(45) Date of Patent: Apr. 5, 2016

(54) RESISTANCE MEMORY CELL

(75) Inventors: Mark D. Kellam, Siler City, NC (US); Gary Bela Bronner, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 47 days.

(21) Appl. No.: 14/125,913

(22) PCT Filed: Jun. 22, 2012

(86) PCT No.: PCT/US2012/043884
§ 371 (c)(1),
(2), (4) Date: Dec. 12, 2013

(87) PCT Pub. No.: WO2012/178114
PCT Pub. Date: Dec. 27, 2012

(65) Prior Publication Data
US 2014/0112058 A1 Apr. 24, 2014

(51) Int. Cl.
*G11C 13/00* (2006.01)
*H01L 45/00* (2006.01)
*H01L 27/24* (2006.01)

(52) U.S. Cl.
CPC .............. *G11C 13/004* (2013.01); *G11C 13/00* (2013.01); *G11C 13/003* (2013.01); *G11C 13/0011* (2013.01); *G11C 13/0069* (2013.01); *H01L 27/2409* (2013.01); *H01L 27/2418* (2013.01); *H01L 45/085* (2013.01); *H01L 45/1233* (2013.01); *H01L 45/142* (2013.01);
(Continued)

(58) Field of Classification Search
CPC ..................................................... G11C 13/004
USPC .......................................................... 365/148
See application file for complete search history.

(56) References Cited

U.S. PATENT DOCUMENTS 6,753,561 B1   6/2004   Rinerson et al.
6,870,755 B2   3/2005   Rinerson et al.
(Continued)

FOREIGN PATENT DOCUMENTS

WO   WO-2011-071594 A2   6/2011

OTHER PUBLICATIONS

International Search Report and Written Opinion dated Jan. 24, 2013, re International Application No. PCT/US2012/043884. 11 pages.
(Continued)

*Primary Examiner* — Hoai V Ho
*Assistant Examiner* — Tri Hoang
(74) *Attorney, Agent, or Firm* — Lance Kreisman; Peninsula Patent Group

(57) ABSTRACT

A resistance memory includes a resistance memory cell having a resistance memory element and a two-terminal access device in series. The two-terminal access device affects the current-voltage characteristic of the resistance memory cell. The resistance memory additionally includes a circuit to apply across the resistance memory cell a set pulse having a set polarity to set the resistance memory cell to a low-resistance state that is retained after application of the set pulse, a reset pulse having a reset polarity, opposite to the set polarity, to reset the resistance memory cell to a high-resistance state that is retained after application of the reset pulse, and a read pulse of the reset polarity and smaller in magnitude than the reset pulse to determine the resistance state of the resistance memory cell without changing the resistance state of the resistance memory cell.

20 Claims, 7 Drawing Sheets

(52) U.S. Cl.
CPC ...... *H01L45/143* (2013.01); *G11C 2013/0073* (2013.01); *G11C 2013/0083* (2013.01); *G11C 2213/72* (2013.01)

(56) References Cited

U.S. PATENT DOCUMENTS

| | | | |
|---|---|---|---|
| 7,035,141 B1 | 4/2006 | Tripsas et al. | |
| 7,242,603 B2 | 7/2007 | Hush et al. | |
| 7,372,753 B1 | 5/2008 | Rinerson et al. | |
| 7,379,364 B2 | 5/2008 | Siau et al. | |
| 7,423,902 B2 | 9/2008 | Mori et al. | |
| 7,426,128 B2 | 9/2008 | Scheuerlein | |
| 7,471,543 B2 | 12/2008 | Nakashima et al. | |
| 7,542,326 B2 | 6/2009 | Yoshimura et al. | |
| 7,800,094 B2 * | 9/2010 | Ho et al. | 257/4 |
| 7,835,174 B2 * | 11/2010 | Tokiwa | 365/148 |
| 7,965,539 B2 | 6/2011 | Osano et al. | |
| 8,030,662 B2 * | 10/2011 | Suda | 257/77 |
| 2004/0159867 A1 | 8/2004 | Kinney et al. | |
| 2005/0101086 A1 | 5/2005 | Rinerson et al. | |
| 2005/0167699 A1 | 8/2005 | Sugita et al. | |
| 2006/0250836 A1 | 11/2006 | Herner et al. | |
| 2006/0279979 A1 | 12/2006 | Lowrey et al. | |
| 2007/0008786 A1 | 1/2007 | Scheuerlein | |
| 2007/0165434 A1 | 7/2007 | Lee et al. | |
| 2008/0112207 A1 * | 5/2008 | Pinnow | 365/148 |
| 2008/0123393 A1 | 5/2008 | Kinoshita | |
| 2008/0144357 A1 | 6/2008 | Siau et al. | |
| 2008/0170444 A1 | 7/2008 | Hoenigschmid | |
| 2008/0211036 A1 | 9/2008 | Zhao et al. | |
| 2008/0310209 A1 | 12/2008 | Liu et al. | |
| 2009/0016094 A1 | 1/2009 | Rinerson et al. | |
| 2009/0052225 A1 * | 2/2009 | Morimoto | 365/148 |
| 2010/0090187 A1 | 4/2010 | Ahn et al. | |
| 2010/0208508 A1 | 8/2010 | Baek et al. | |
| 2011/0019462 A1 | 1/2011 | Toda | |
| 2011/0097825 A1 * | 4/2011 | Cheng et al. | 438/14 |

OTHER PUBLICATIONS

Waser et al., "Nanoionics-Based Resistive Switching Memories," Nature Materials, vol. 6, Nov. 2007, pp. 833-840. 8 pages.

* cited by examiner

RESISTANCE MEMORY CELL

BACKGROUND

A conductive-bridging resistance-change memory element, which will be referred to herein as a resistance memory element, has at least two distinct stable resistance states: a low-resistance state and a high-resistance state. A resistance memory element can be switched from a high-resistance state to a low-resistance state by the application of a voltage pulse of one polarity and can be switched from a low-resistance state to a high-resistance state by the application of a voltage pulse of the opposite polarity. Each resistance state is used to represent a respective data value, e.g., 1 or 0. Since the resistance changes can be accomplished by applying low-voltage pulses to the resistance memory element, and the resistance state of the resistance memory element can be determined by applying a voltage or a current to the resistance memory element, resistance memory elements are attractive for use in low-cost, high-density memory arrays.

FIG. 1 depicts the basic current-voltage characteristics of an exemplary resistance memory element. Initially, the resistance memory element is in a high-resistance state. Applying a positive voltage pulse having a magnitude greater a first threshold voltage that will be referred to herein as a SET voltage to the resistance memory element causes the resistance of the resistance memory element to drop by several orders of magnitude and a corresponding increase in the current through the resistance memory element. In an example, the SET voltage is about 250 millivolts (mV). Applying a positive voltage pulse having a magnitude greater than the SET voltage changes the resistance memory element from a high-resistance state that will be referred to as a reset state to a low-resistance state that will be referred to herein as a set state. The high-resistance state of a resistance memory element will be referred to herein as a reset state and the low-resistance state will be referred to as a set state. The names of the states can be interchanged.

Applying a negative voltage pulse having a magnitude greater than a second threshold voltage that will be referred to herein as a RESET voltage causes the resistance of the resistance memory element to increase by several orders of magnitude and a corresponding decrease in the current through the resistance memory element. In an example, the RESET voltage is about −80 mV. Applying a negative voltage pulse having a magnitude greater than the RESET voltage changes the resistance memory element from the low-resistance set state back to the high-resistance reset state.

Application of a read pulse having a voltage less than the SET voltage to the resistance memory element causes a read current to flow through the resistance memory element. As shown in FIG. 1, the read current differs significantly depending on whether the resistance memory element is in the low-resistance set state or in the high-resistance reset state. By measuring the read current (or comparing the read current with a threshold), the resistance state of the resistance memory element can be detected and, hence, the data represented by the resistance state of the resistance memory element can be read.

In a memory array composed of resistance memory elements, parasitic currents can pass through unselected resistance memory elements. Such parasitic currents can make it difficult or impossible to determine whether the measured read current represents the high-resistance state or the low-resistance state of the resistance memory element that was selected to be read. Since the read current is used to determine the data value stored in the resistance memory element, it is consequently difficult to determine the value of the stored data. To alleviate this problem, access devices are used to select the resistance memory element to be read. The access devices are used to suppress or minimize the parasitic currents that flow through unselected resistance memory elements. However, the use of an access device alters the current-voltage behavior of a resistance memory cell that incorporates a resistance memory element and an access device.

BRIEF DESCRIPTION OF THE DRAWINGS

The subject matter disclosed is illustrated by way of example, and not by way of limitation, in the figures of the accompanying drawings in which the like reference numerals refer to similar elements and in which.

DETAILED DESCRIPTION

Figure 1:
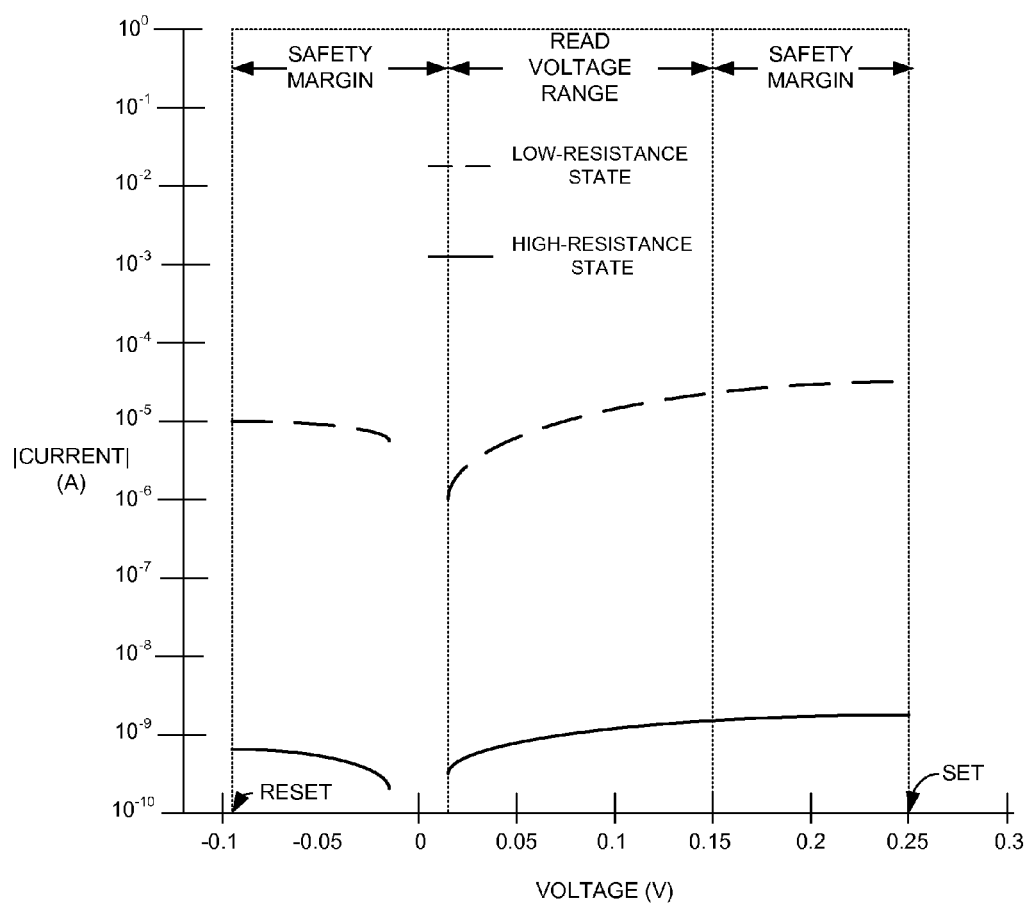
FIG. 1 is a graph showing the current-voltage characteristic a resistance memory element.

A number of different memory technologies are based on resistance change. Magneto resistance random access memories utilize a magnetic field to affect the resistance change. Phase-change random access memories utilize thermal processes to control a phase transition in a resistance change material. The phase transition is from an amorphous to a crystalline state. A conductive-bridging resistance-change random access memory ("CB-RAM") is a type of resistance change memory technology that is based on the electrically-stimulated change of the resistance of a metal-insulator-metal resistance memory cell.

CB-RAM memory elements based on solid electrolytes, sometimes known as programmable metallization elements, are of particular interest due to the ability of low voltages to change their resistance states and their potential for high scalability. Typically, CB-RAM memory elements, which are referred to herein as resistance memory elements have a dielectric material disposed between two electrodes. One of the electrodes is composed of a metal that is a source of mobile ions of the metal, and is referred to herein as an active electrode. The other of the electrodes is composed of a metal that is not a significant source of ions of the metal, and is referred to herein as an inert electrode. Initially, the resistance between the electrodes is high, and the resistance memory element is said to be in a high-resistance state. Application of a set pulse having a first characteristic between the electrodes forms one or more conductive metal filaments that extend through the dielectric material from the active electrode to the inert electrode. The filament is composed of metal supplied by the active electrode. Formation of the filament establishes a conductive path that significantly reduces the resistance between the electrodes. After the conductive filaments have been established, the resistance memory element is said to be in its low-resistance state in which the resistance between the electrodes is several orders of magnitude less than in the high-resistance state. Application of a reset pulse having a second characteristic, different from the first characteristic, breaks the conductive filament, which resets the resistance memory element to its high-resistance state. Reapplication of a set pulse having the first characteristic re-forms the conductive filament, which once more sets the resistance memory element to its low-resistance state. The resistance state of the resistance memory element can be changed by application of electrical pulses having appropriate characteristics. The resistance memory element retains its resistance state after application of the electrical pulse. The persistence of the electrical states after application of the electrical pulses depends at least on the properties of the resistance memory element and the characteristics of the electrical pulses. In some cases, the persistence can be sufficiently long that the resistance memory element can be regarded as a non-volatile memory element.

In accordance with various embodiments, a resistance memory includes a resistance memory cell having a resistance memory element and a two-terminal access device connected in series with the resistance memory element. The two-terminal access device is configured to enable a bi-directional flow of current through the resistance memory element in response to application of a voltage greater than a threshold voltage. The resistance memory additionally includes a circuit that applies across the resistance memory cell what will be referred to herein as a set pulse having a set polarity to set the resistance memory cell to a low-resistance set state that is retained after application of the set pulse, that applies across the resistance memory cell what will be referred to herein as a reset pulse having a reset polarity, opposite the set polarity, to reset the resistance memory cell to a high-resistance reset state that is retained after application of the reset pulse and that applies across the resistance memory cell what will be referred to herein as a read pulse of the reset polarity and smaller in magnitude than the reset pulse to determine the resistance state of the resistance memory cell without changing the resistance state of the resistance memory cell.

Figure 2A:
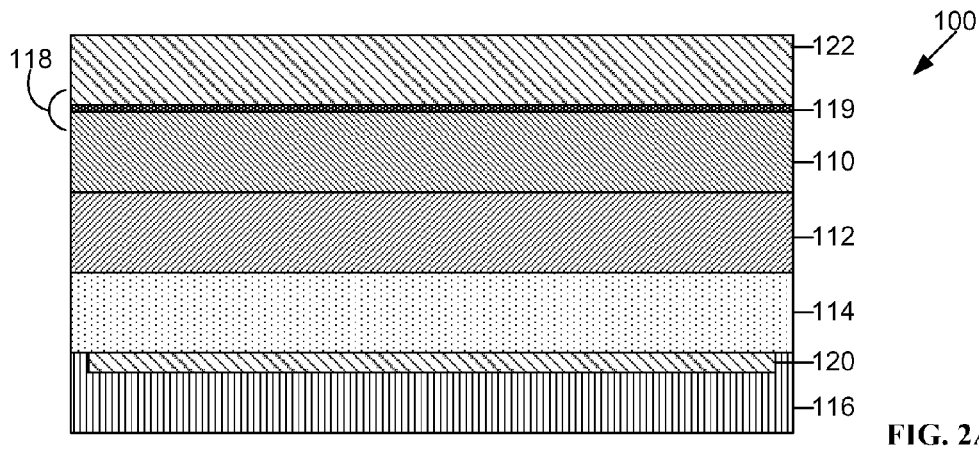
FIGS. 2A-2C are cross-sectional views of the physical structures of resistance memory cells in accordance with various embodiments.
Figure 2B:
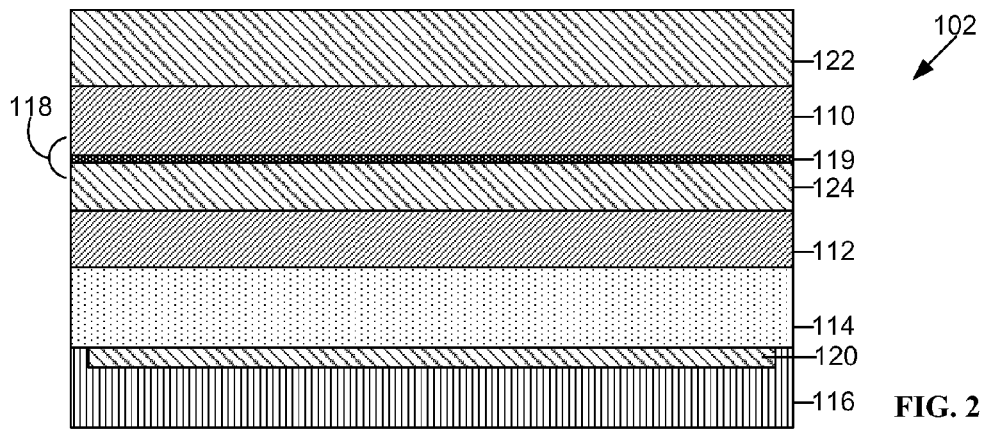
Figure 2C:
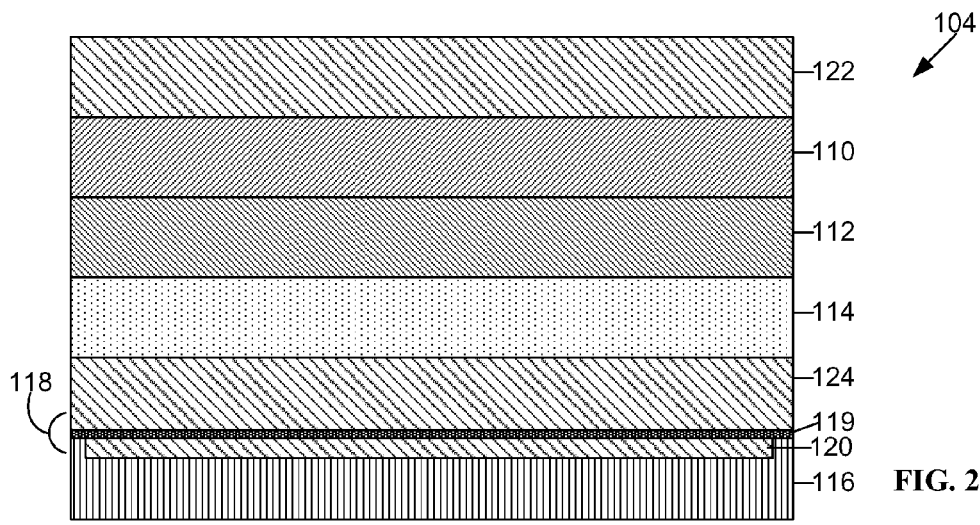

FIGS. 2A, 2B and 2C are cross-sectional views showing examples of resistance memory cells 100, 102, 104 in accordance with various embodiments. The resistance memory cell embodiments can be used in applications that currently use, for example, DRAM, SRAM, PROM, EPROM, NAND or NOR memory cells. The physical structure of the resistance memory cells may be configured in various forms. Regardless of the form, each resistance memory cell 100, 102, 104 includes a resistance memory element having an inert electrode 110, an electrolyte layer 112, and an active electrode 114, and a two-terminal access device 118 connected in series with the resistance memory element. The two-terminal access device 118 may be located almost anywhere within resistance memory cell 100, 102, 104 except that it may not be interposed between the electrolyte layer 112 and the active electrode 114.

FIG. 2A shows an example of a resistance memory cell 100 in accordance with an embodiment. The resistance memory cell 100 has a substrate 116 over which are located, in order, a first contact electrode 120; an active electrode 114; an electrolyte layer 112; an inert electrode 110; a two-terminal access device 118; and a second contact electrode 122. Examples of the material of the substrate 116 include, but are not limited to, monocrystalline silicon, silicon-germanium, silicon-germanium-carbon, or any other semiconductor material. Typically, other circuitry (not shown) is fabricated in and/or on the substrate 116 in addition to the resistance memory cell 100.

In an embodiment, the first and second contact electrodes 120, 122 are portions of conductive array lines (e.g., word lines or bit lines). The first contact electrode 120 is formed by depositing a layer of contact electrode material over the substrate 116 using a suitable deposition process such as, but not limited to, sputtering, evaporation or chemical vapor deposition. The layer of contact electrode material is then patterned to define the first contact electrode 120. The contact electrode material of the first contact electrode 120 and the second contact electrode 122 can be any material that is electrically conductive and does not react with metal ions in the layers in contact with the respective contact electrode 120, 122. Examples of contact electrode material include, but are not limited to, platinum (Pt), tungsten (W), aluminum (Al), palladium (Pd), iridium (Ir), and alloys that include these metals.

The material of the active electrode 114 is an electrochemically-reactive metal, such as silver (Ag) or copper (Cu), which is a source of mobile metal ions. In an example, a layer of the material of the active electrode 114 is deposited over the substrate 116 by any suitable deposition technique (e.g., evaporative deposition, sputtering deposition, electroplating, etc.) and is then patterned using any suitable patterning process (e.g., selective chemical etching, etc.) to define the active electrode 114. The thickness of the active electrode 114 depends on a conductance preference.

The electrolyte layer 112 is interposed between the active electrode 114 and the inert electrode 110. The material of the electrolyte layer 112 is a solid electrolyte. Examples include, but are not limited to, germanium selenide (GeSe) and germanium sulfide (GeS). The electrolyte layer 112 is formed by depositing a layer of electrolyte material using a sputtering deposition process such as radio frequency sputtering or magnetron sputtering. The thickness of electrolyte material deposited is typically between 20 nm-200 nm. The layer of electrolyte material is then patterned to define the electrolyte layer 112 using a suitable patterning process, such as a selective chemical etch.

The inert electrode 110 is located in contact with the electrolyte layer 112 opposite the active electrode 114. The material of the inert electrode 110 is a chemically-inert electrical conductor. Examples of the material of the inert electrode 110 include, but are not limited to, tungsten (W), titanium (Ti), aluminum (Al), nickel (Ni), platinum (Pt) and alloys that include these metals. The inert electrode 110 is formed by depositing a layer of inert electrode material by a process such as vacuum evaporation or sputtering, and then patterning the layer using a suitable patterning process. The inert electrode 110 has a minimum thickness of about 50 nanometers (nm).

The two-terminal access device 118 is composed of a metal oxide film 119 interposed between two electrodes. In the example shown in FIG. 2A, the inert electrode 110 and the second contact electrode 122 provide the electrodes of the two-terminal access device 118. The metal oxide film 119 of the two-terminal access device 118 is a thin film of a metal oxide such as, but not limited to, magnesium oxide (MgO), aluminum oxide ($Al_2O_3$), silicon dioxide ($SiO_2$), and zinc oxide (ZnO). In an example, the metal oxide film 119 of the two-terminal access device 118 is formed by depositing a thin layer of a metal oxide over the inert electrode 110 using atomic layer deposition, and then patterning the metal oxide layer to define the metal oxide film. In another example, a thin layer of metal (e.g., aluminum) is deposited over the inert electrode 110. The metal layer is patterned and then oxidized to form the metal oxide film 119 of the two-terminal access device 118.

The second contact electrode 122 is formed by depositing a layer of contact electrode material using a deposition process that will not damage the metal oxide film 119 of the two terminal access device 118. In an example, a layer of contact electrode material is deposited over the metal oxide film 119 by evaporation or chemical vapor deposition. The layer of contact electrode material is then patterned to define the second contact electrode 122.

FIG. 2B shows an example of a resistance memory cell 102 in accordance with another embodiment in which the two-terminal access device 118 is interposed between the inert electrode 110 and the electrolyte layer 112. In this embodiment, the two-terminal access device 118 includes an internal electrode 124 located over electrolyte layer 112 that provides one electrode of the two-terminal access device 118, and the metal oxide film 119 of the two-terminal access device 118 is located over the internal electrode 124. The inert electrode 110 is located over the metal oxide film 119 and provides the other electrode of the two-terminal access device 118. The internal electrode 124 isolates the metal oxide film 119 of the two-terminal access device from the electrolyte layer 112. The internal electrode 124 is formed by depositing a layer of contact electrode material over the electrolyte layer 112 by a suitable deposition process, and patterning the layer of contact electrode material to define the internal electrode. The metal oxide film 119 of the two-terminal access device is then formed over the internal electrode in a manner similar to that described above with reference to FIG. 2A.

FIG. 2C shows an example of a resistance memory cell 104 in accordance with another embodiment in which the two-terminal access device 118 is located between the second contact electrode 122 and the active electrode 114. In this embodiment, the two-terminal access device includes the internal electrode 124 over the metal oxide film 119. The internal electrode provides one electrode of the two-terminal access device. The first contact electrode 120 provides the other electrode of the two-terminal access device. The internal electrode 124 isolates the metal oxide film 119 of the two-terminal access device 118 from the active electrode 114. In this embodiment, the metal oxide film 119 of the two-terminal access device 118 is formed over the first contact electrode 120 in a manner similar to that described above with reference to FIG. 2A. The internal electrode 124 is formed by depositing a layer of contact electrode material over the metal oxide film 119 using a deposition process that will not damage the metal oxide film 119, and patterning the layer of contact electrode material to define the internal electrode. A layer of active electrode material is then deposited and is patterned to define the active electrode 114.

Each of the resistance memory cells 100, 102, 104 has two stable resistance states that enable the resistance memory cell to represent a binary data value, either a '0' data value or '1' data value. The convention used to associate a data value with a resistance state of the resistance memory cell is arbitrary. For the purposes of this disclosure, a resistance memory cell 100, 102, 104 is said to represent a '1' data value when in its reset state and to represent a '0' data value when in its set state. As noted above, the set state of the resistance memory cell refers to the low-resistance state of the resistance memory cell, and the reset state of the resistance memory cell refers to the high-resistance state of the resistance memory cell. The names of the high-resistance state and the low-resistance state may be interchanged, however.

Each resistance memory cell 100, 102, 104 is changed from its high-resistance state to its low-resistance state by applying between a set pulse between the active electrode 114 and the inert electrode 110. The set pulse is a voltage pulse having a defined voltage and duration, and a polarity such that active electrode 114 is positive with respect to the inert electrode 110. The set pulse will be referred to herein as having a positive polarity. Applying the set pulse to resistance memory cell 100, 102, 104 is referred to herein as performing a set operation. Depending on the material of the electrolyte layer 112 and the dimensions of the resistance memory cell, the resistance of the resistance memory cell 100, 102, 104 in the set state typically ranges from $10^2$ to $10^4$ ohms.

Each resistance memory cell 100, 102, 104 is changed from its low-resistance set state to its high-resistance reset state by applying a reset pulse between active electrode 114 and inert electrode 110. The reset pulse is a voltage pulse having a defined voltage and duration, and a polarity opposite that of the set pulse. Applying the reset pulse to the resistance memory cell is referred to herein as a performing a reset operation. Depending on the material of the electrolyte layer 112 and the dimensions of the resistance memory cell, the resistance of the resistance memory cell in the reset state typically ranges from $10^6$-$10^8$ ohms.

Figure 3:
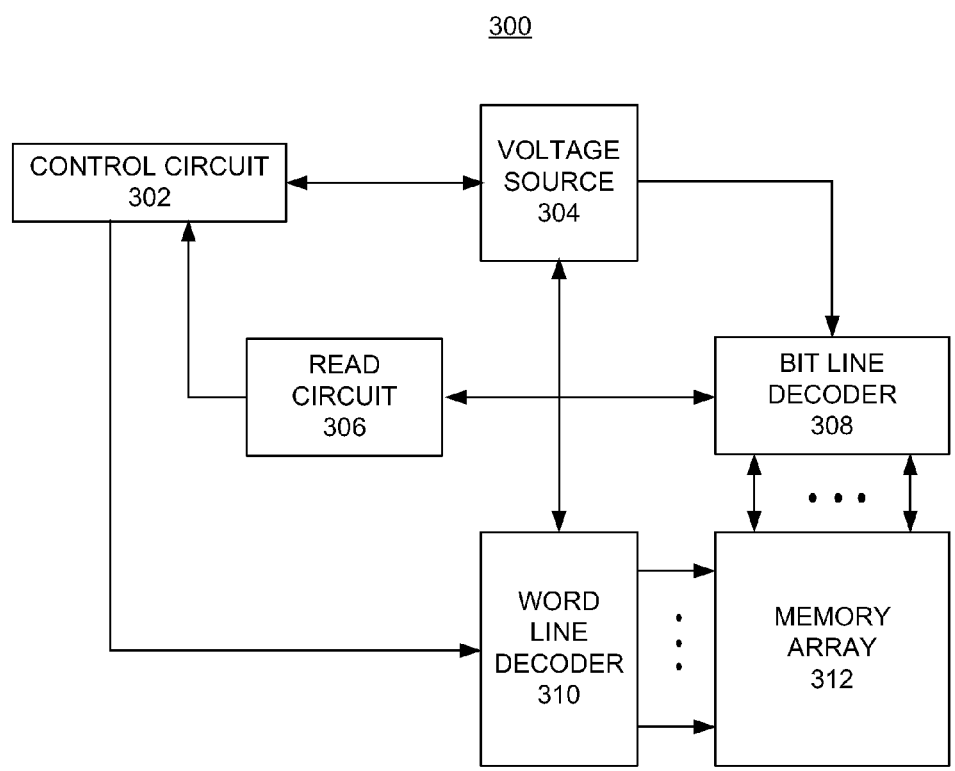
FIG. 3 is a block diagram showing an exemplary memory device utilizing resistance memory cells in accordance with various embodiments.

In some applications, the resistance memory cells 100, 102, 104 are incorporated into a memory device 300, an example of which is shown in FIG. 3. In the example shown, the memory device 300 is embodied as a memory integrated circuit (IC) supported by a common structure and coupled directly to other ICs, such as a memory controller (not shown). In an example, one or more other ICs and the memory IC embodying memory device 300 are packaged within a single multi-chip module and are connected by bond wires or other conducting structures, such as through-semiconductor vias (TSVs). In another embodiment, the memory device 300 is part of a memory system or memory module that, together with one or more circuits, such as a memory controller, constitutes part of an IC. Memory device 300 is connected to such one or more other circuits by traces defined in one or more metal layers or other conducting structures within the IC.

In the example shown, the memory device 300 has a control circuit 302, a voltage source 304, a read circuit 306, a bit line decoder 308, a word line decoder 310, and a memory array 312. The control circuit 302 controls the read, set, and reset operations on the memory array 312. The control circuit 302 receives address (ADDR), command (CMD), data (DATA), and clock (CLK) signals from a data bus connected to an external source (e.g., a memory controller). The voltage source 304 supplies to the bit line decoder 308 and the word line decoder 310 the voltages and voltage pulses needed to perform read, set, and reset operations. The read circuit 306 includes a sense amplifier (not shown) that receives a read current from a resistance memory cell selected by the bit line decoder 308 and from the read current determines the resistance state of the resistance memory cell. The word line decoder 310 selects the word line of the memory array 312 corresponding to the address input and the bit line decoder 308 selects the bit line of the memory array 312 corresponding to the address input.

Figure 4:
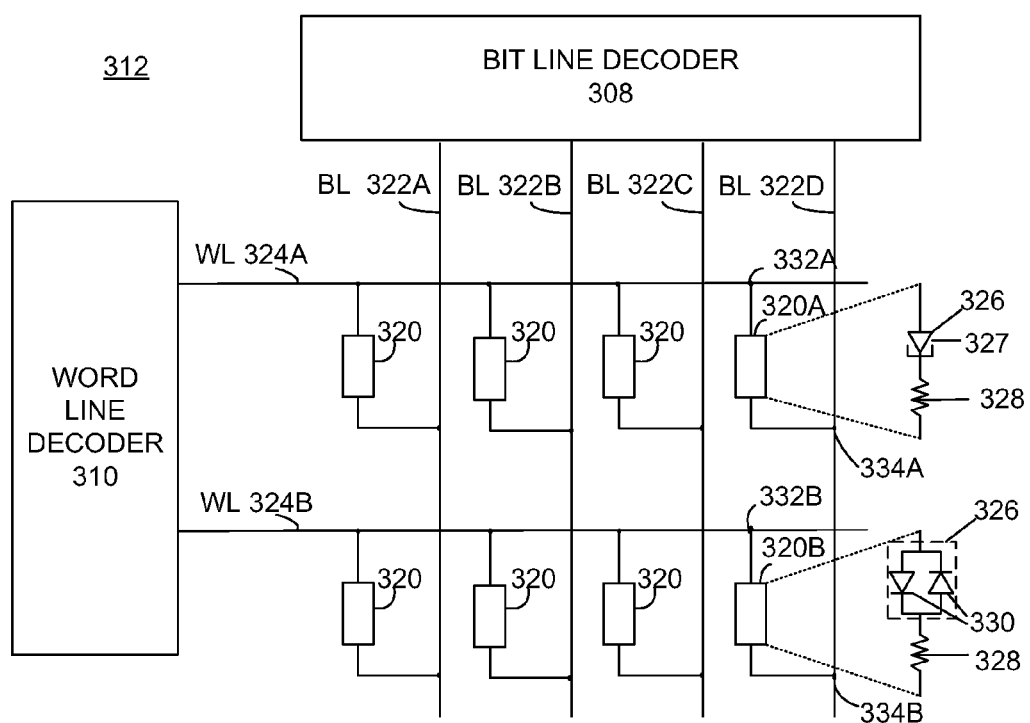
FIG. 4 is a block diagram showing a portion of an exemplary memory array used in the memory device shown in FIG. 3.

FIG. 4 shows a portion of an example of the memory array 312. In an embodiment, the memory array 312 is arranged in a cross-point configuration having word lines WL 324A, 324B and bit lines, BL 322A, 322B. The word lines WL 324A, 324B and the bit lines BL 322A, 322B, extend orthogonally to each other and a resistance memory cell 320 is located at each intersection of a word line and a bit line. The word lines WL 324A, 324B are coupled to the word line decoder 310, which selects one of the word lines connected to a corresponding row of the resistance memory cells 320. The bit lines BL 322A-322D are coupled to the bit line decoder 308, which selects one of the bit lines connected to a corresponding column of the resistance memory cells 320. The resistance memory cell 320 at the intersection of the selected word line and the selected bit line is subject to a read, reset or set operation, depending on the duration, magnitude and polarity of respective voltage pulses applied across the resistance memory cell via the selected word line and the selected bit line.

FIG. 4 also shows an example of a resistance memory cell 320A that has a two-terminal access device 326 embodied as a tunnel diode 327 connected in series with a resistance memory element 328. FIG. 4 also shows another example of a resistance memory cell 320B that has a two-terminal access device 326 embodied as two back-to-back diodes 330 connected in parallel. The two-terminal access device 326 is connected in series with the resistance memory element 328. The diodes 330 may be junction diodes, Schottky diodes or back-to-back diodes of another suitable type. The diodes are typically fabricated in and/or on the substrate 116 (FIG. 2A-2C)

Regardless of the embodiment of the two-terminal access device 326, the resistance memory cells 320A, 320B are connected between first terminals 332A, 332B, respectively, and second terminals 334A, 334B, respectively. The first terminals 332A, 332B are connected to a respective word line 324A, 324B and the second terminals are connected to a respective bit line 322C, 322D.

The two-terminal access device 326 allows current to flow in either direction through the resistance memory element 328 during memory operations (i.e., read, set, or reset operations) performed on the selected resistance memory cell 320. Each resistance memory cell 320 is subject to a chosen memory operation by a corresponding voltage pulse applied across the resistance memory cell. The voltage of the voltage pulse applied to the resistance memory cell 320 is the voltage difference between a voltage on the selected wordline 324A, 324B and a voltage on the selected bit line 322A-322D. Voltage pulses may be applied to both the selected wordline and the selected bitline, or to only one of the selected wordline and the selected bitline, with a constant voltage being applied to the other of the selected wordline and the selected bitline. The voltages applied to the selected wordline and the selected bitline are voltages relative to an arbitrary reference, such as ground or a common source voltage $V_{SS}$.

Operation of the memory array 312 will now be described. References below to a voltage applied to or across a memory cell refer to the voltage of a voltage pulse applied across the memory cell. The presence of the two-terminal access device 326 in the resistance memory cell 320 imposes a voltage threshold on the current-voltage characteristic of the resistance memory cell. The voltage applied across the selected resistance memory cell 320 needs to exceed a threshold voltage before a current sufficient to perform a memory operation can flow through the resistance memory cell. The threshold characteristic of the two-terminal access device 326 in each resistance memory cell 320 reduces or eliminates the parasitic current that would otherwise flow through each unselected resistance memory cell 320 having a terminal 332, 334 electrically coupled to the selected word line 324A, 324B or the selected bit line 322A-322D.

When a relatively low voltage is applied across resistance memory cell 320, as occurs when the resistance memory cell 320 is not selected for a memory operation, the voltage across the two-terminal access device 326 is also low. As a result, the two-terminal access device has a high dynamic resistance. The dynamic resistance of the two-terminal access device is the rate of change of voltage with current at a given voltage across the two-terminal access device. The high dynamic resistance of the two-terminal access device significantly reduces the parasitic current flow. In a typical embodiment, the high dynamic resistance of the two-terminal access device reduces the parasitic current flow to less than a threshold current at which the parasitic current can be regarded as being negligible. Accordingly, the two-terminal access device can be said to eliminate the parasitic current flow through the non-selected resistance memory cells.

When a higher voltage is applied across the resistance memory cell 320, as occurs when the resistance memory cell 320 is selected for a memory operation, the dynamic resistance of the two-terminal access device 326 falls to a level that is small compared with the resistance of the resistance memory element 328. The low dynamic resistance of the two-terminal access device allows set and reset operations to be performed on the resistance memory cell 320, and allows the resistance state of the resistance memory element 328 to be rapidly and reliably determined during read operations. Since the read, set, and reset voltages applied to the resistance memory cell 320 during memory operations collectively have both positive and negative polarities, two-terminal access device 326 has a threshold current-voltage characteristic in both the forward and reverse directions. Typically, the two-terminal access device 326 has a symmetrical non-linear current-voltage characteristic. As used in this disclosure, the term symmetrical will be taken also to encompass near-symmetrical.

Figure 5:
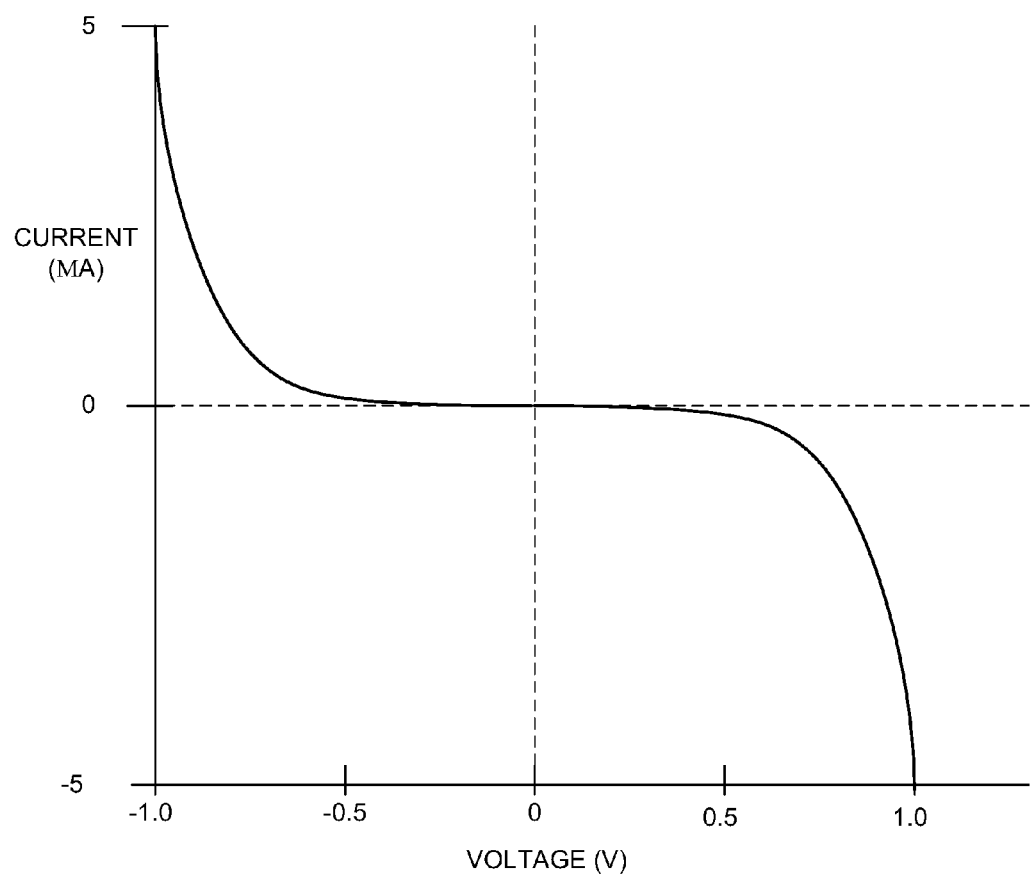
FIG. 5 is a graph showing the current-voltage characteristic of an exemplary two-terminal access device.

FIG. 5 is a graph showing the current-voltage characteristic of an example of the two-terminal access device 326. In the example shown, the current-voltage characteristic is symmetrical between voltages of positive polarity and applied voltages of negative polarity. The current-voltage characteristic of the two-terminal access device is sufficiently non-linear that it can be regarded as being a threshold characteristic: a voltage greater that a threshold voltage is needed for the two-terminal access device to conduct a current greater than a defined current. In the example of two-terminal access device 326 shown, an applied voltage of +0.7 V or an applied voltage of −0.7 V is needed for the two-terminal access device to conduct a current greater than approximately 1 μA. Referring additionally to FIG. 4, elements exhibiting a near-symmetrical or symmetrical non-linear current-voltage characteristic and suitable for use as the two-terminal access device 326, include, but are not limited to, a tunnel diode 327 and two back-to-back diodes 330 connected in parallel.

Referring again to FIG. 4, the resistance memory cell 320 is composed of the resistance memory element 328, whose resistance (regardless of whether the resistance memory element is in its set state or its reset state) during a read operation is relatively voltage independent, and the two-terminal access device 326, whose dynamic resistance is highly voltage dependent. The resistance memory element and the two-terminal access device form a potential divider. Any voltage applied across the resistance memory cell 320 is divided into a voltage across the resistance memory element 328 and a voltage across the two-terminal access device 326. Only the voltage across the resistance memory element 328 will change the state of the resistance memory element. The division of the applied voltage across the resistance memory element 328 and the two-terminal access device 326 is determined by the resistance of the resistance memory element and the dynamic resistance of the two-terminal access device, which is highly voltage dependent.

With a voltage of small magnitude (the polarity is immaterial to this part of the disclosure) applied to the resistance memory cell 320, the dynamic resistance of the two-terminal access device 326 dominates the resistance of the resistance memory cell 320 and relatively little of the applied voltage appears across the resistance memory element 328. As the magnitude of the applied voltage increases, the dynamic resistance of the two-terminal access device 326 decreases roughly in proportion to the exponent of the increase in voltage across the two-terminal access device. Consequently, a greater fraction of the applied voltage appears across the resistance memory element 328.

A relatively low set voltage is sufficient to change a resistance memory cell 320 whose resistance memory element 328 is in the high-resistance reset state to the set state. In the high-resistance reset state of the resistance memory element 328, a smaller fraction of the set voltage applied to the resistance memory cell 320 appears across the two-terminal access device 326, and a greater fraction of the set voltage appears across the resistance memory element 328. Consequently, the SET voltage of the resistance memory element 328 will be obtained with a relatively low set voltage applied across the resistance memory cell 320. In an example, the set voltage is 1.2 V.

A higher reset voltage is needed to change a resistance memory cell 320 whose resistance memory element is in the low-resistance set state to the reset state. In the low-resistance set state of the resistance memory element, a greater fraction of the set voltage applied to the resistance memory cell 320 appears across the two-terminal access device 326, and a smaller fraction of the reset voltage appears across the resistance memory element 328. Consequently, a relatively high reset voltage has to be applied across the resistance memory cell 320 before the RESET voltage of the resistance memory element 328 is obtained. In an example, the reset voltage is 2.0 V.

When the resistance memory cell 320 is subject to a read operation, a read voltage smaller in magnitude than a voltage that would change the state of the resistance memory cell, i.e., the set voltage or the reset voltage, is applied across the resistance memory cell 320 is divided as described above between a voltage across the resistance memory element 328 and a voltage across the two-terminal access device 326. The smaller magnitude of the read voltage prevents the read voltage from changing the resistance state of the resistance memory cell 320. In the memory array 312, the read voltage has the same polarity as the reset voltage. Application of the read voltage across the memory cell 320 generates a read current that depends on the resistance state of the resistance element 328. The above-mentioned sense amplifier (not shown) in the read circuit 306 (FIG. 3) receives the read current from the resistance memory cell 320 via the bit line decoder 308 and from the read current determines the resistance state of the resistance memory cell 320.

The read current that results from application of the read voltage to the resistance memory cell 320 is characterized by a read current ratio, which is the ratio between the read current from the resistance memory cell 320 with the resistance memory element 328 in its low-resistance state and the read current from the resistance memory cell with the resistance memory element in its high-resistance state. As described above with reference to FIG. 1, a useable read voltage is one that provides an easily-measured read current ratio. A sense amplifier can determine the resistance state of the resistance memory cell 320 faster, more reliably and with simpler circuitry with a large read current ratio than with a small read current ratio. Most of examples described herein are for use with fast, simple sense amplifiers and use a minimum read current ratio of 100. Other examples use a minimum read current ratio greater than or less than 100. In addition, the useable read voltage differs from the maximum possible read voltage, i.e., the set voltage or the reset voltage, by a safety margin that ensures that the read operation will not inadvertently alter the resistance state of the resistance memory cell 320. The examples described herein use a safety margin of 200 mV. Other examples use a safety margin greater than or less than 200 mV.

With a low read voltage r applied across the resistance memory cell 320, the resistance of the two-terminal access device 326 dominates the resistance of the resistance memory cell 320 and prevents the sense amplifier (not shown) in the read circuit 306 from reliably determining the resistance state of the resistance memory cell. Increasing the read voltage decreases the dynamic resistance of the two-terminal access device roughly in proportion to the exponent of the increase in read voltage. At read voltages greater than a threshold voltage, the dynamic resistance of the two-terminal access device 326 becomes sufficiently small that the resistance of the resistance memory element becomes a significant part of the resistance of the resistance memory cell 320. This allows the sense amplifier to determine the resistance state of the resistance memory cell 320 by measuring current from the resistance memory cell. In an example, a relatively complex sense amplifier is able to determine the resistance state of the resistance memory cell 320 when the read voltage is such that the dynamic resistance of the two-terminal access device 326 is less than the resistance of the resistance memory element 328 in its high-resistance state. In this example, the read current ratio is about 2. In another example, a simpler sense amplifier is able to rapidly and reliably determine the resistance state of the resistance memory cell 320 by using a higher read voltage at which the dynamic resistance of the two-terminal access device 326 is less than one-hundredth of the resistance of the resistance memory element 328 in its high-resistance state. In this example, the read current ratio is about 100. Many other combinations of sense amplifier complexity, time to determine the resistance state of the resistance memory cell 320, read current ratio and read voltage are possible.

As described above, a relatively low set voltage (about 1.2 V in the example described) applied to a resistance memory cell whose resistance memory element is in the high-resistance reset state is sufficient to set the resistance memory element to the set state. Consequently, a set-polarity read voltage applied to the resistance memory cell 320 has to be less than the above-described set voltage by the above-described safety margin to prevent the read voltage from inadvertently changing the state of the resistance memory cell when its resistance memory element is in its high-resistance reset state. Thus, in the above example, the possible range of the read voltage is from 0V to 1.0 V (200 mV less than the magnitude of the exemplary set voltage described above).

Figure 6:
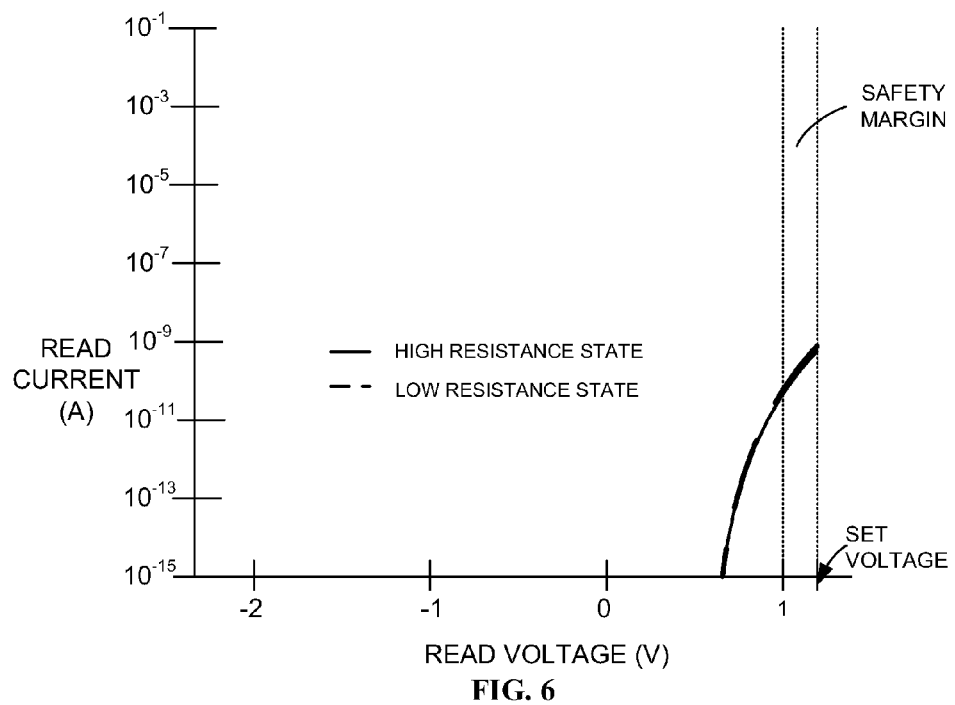
FIG. 6 is a graph showing the current-voltage characteristic of an example of a resistance memory cell read using read voltages of the set polarity in accordance with an embodiment.

FIG. 6 is a graph showing the current-voltage characteristic of an example of the resistance memory cell 320 with a read voltage of the set polarity. With a read voltage of the set polarity in the permissible voltage range from 0 V to about +1.0 V, the dynamic resistance of the two-terminal access device 326 is so high compared with the resistance of the resistance memory element 328 that there is no easily-measured difference between the read current in the high-resistance reset state and the read current in the low-resistance set state of the resistance memory cell 320. Nowhere in the permissible range of the set-polarity read voltage does the read current in the high-resistance reset state differ measurably from the read current in the low-resistance set state. Thus, in this example, no set-polarity read voltage exists that will give a read current ratio between the read current in low-resistance state and the read current in the high-resistance state of greater than 100, and a read voltage safety margin of 200 mV.

Thus, although it may be possible to perform a read operation using a set-polarity read voltage by reducing the voltage safety margin and using a read voltage greater than 1 V, the resulting small read voltage range and small read current ratio would require a more complex sense amplifier. Such a sense amplifier would require a larger chip area and would require a longer read time to determine the resistance state represented by the read current. This would decrease the overall memory access speed. Both of these characteristics are undesirable in a low-cost high-density memory array.

As described above, a reset voltage substantially greater in magnitude than, and opposite in polarity to (about −2.0 V in the example described), the set voltage applied to a resistance memory cell 320 whose resistance memory element 328 is in the low-resistance set state will reset the resistance memory cell to its reset state. The reset voltage is greater in magnitude the set voltage because, in the low-resistance set state of the resistance memory element, the resistance of the resistance memory element 328 is low, so that most of the reset voltage appears across the two-terminal access device 326 and relatively little of the reset voltage appears across the resistance memory element 328. As a result, a relatively high reset voltage has to be applied across the resistance memory cell 320 before the voltage across the resistance memory element 328 exceeds the RESET voltage of the resistance memory element and the resistance memory cell 320 returns to its reset state.

Figure 7:
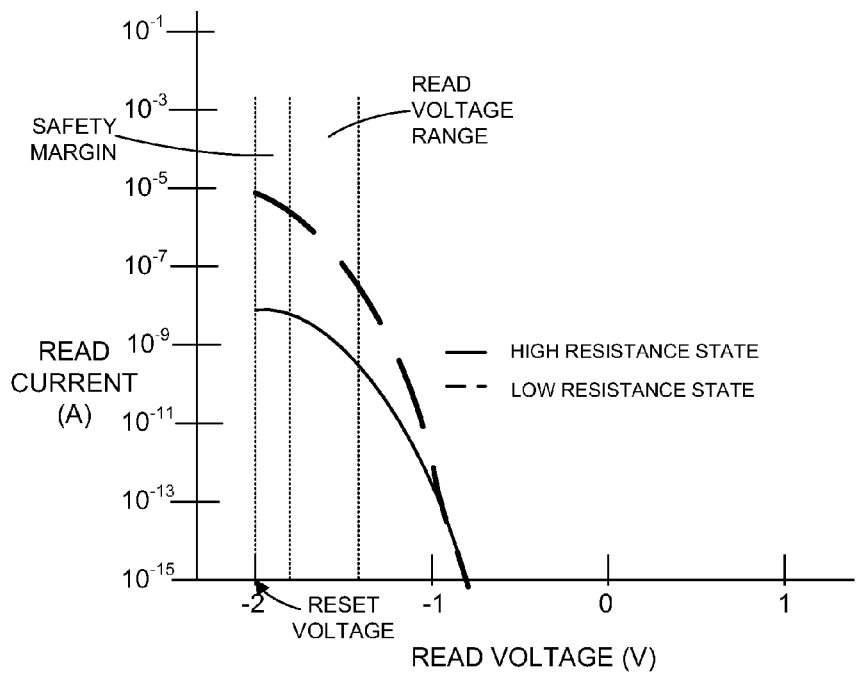
FIG. 7 is a graph showing the current-voltage characteristic of a resistance memory cell read using read voltages of the reset polarity in accordance with an embodiment.

The magnitude of the reset-polarity read voltage applied across the resistance memory cell 320 has to be less than that of the reset voltage by a suitable safety margin to prevent the read voltage from inadvertently changing the state of the resistance memory cell when the resistance memory element 328 is in its low-resistance set state. FIG. 7 is a graph showing the current-voltage characteristic of an example of the resistance memory cell 320 with a read voltage of the reset polarity. The range of permissible reset-polarity read voltage magnitudes from 0 V to 1.8 V (200 mV less than the magnitude of the exemplary reset voltage described above) includes a substantial range of read voltage magnitudes (from 1.0 V to 1.8 V in the above-described example) in which the read voltage provides a voltage across the two-terminal access device 326 greater than the above-described threshold voltage at which the dynamic resistance of the two-terminal access device 326 no longer prevents the sense amplifier from determining the state of the resistance memory cell 320. Moreover, at read voltage magnitudes greater than about 1.4 V, the dynamic resistance of the two-terminal access device 326 is a sufficiently small fraction of the resistance of the resistance memory cell 320 with the resistance memory element 328 in its reset (high resistance) state that the read current ratio between the set and reset states of the resistance memory cell is greater than 100. Such a read current ratio allows the sense amplifier to rapidly and reliably determine the resistance state of the resistance memory cell. Accordingly, in this example, the resistance memory cell 320 can be read using a read voltage in a range that extends from about −1.4 volts to about −1.8 volts. The larger read voltage range and the large read current ratio obtained by reading at the reset polarity makes it possible for a simple sense amplifier to read the state of the resistance memory cell rapidly and reliably, and without causing inadvertent state changes.

Figure 8:
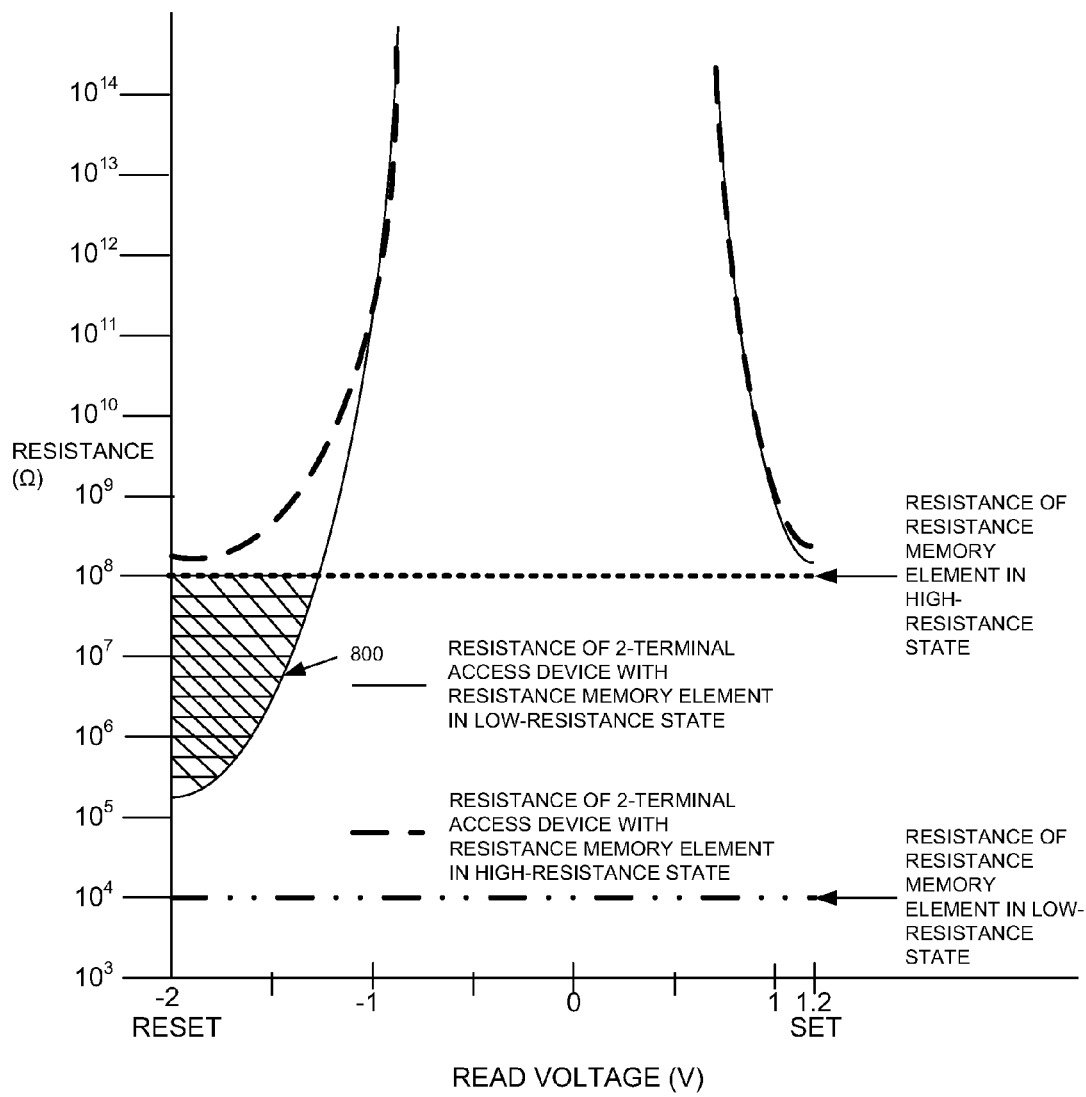
FIG. 8 is a graph showing the dynamic resistance-voltage characteristic of a resistance memory cell in accordance with various embodiments.

FIG. 8 is a graph illustrating the dynamic resistance-voltage characteristic of the two-terminal access device 326 of the resistance memory cell 320 described in FIGS. 6 and 7. The two-terminal access device 326 is connected in series with the resistance memory element 328. In the example shown, the resistance of the resistance memory element 328 in its high-resistance state is $10^8$ ohms and the resistance of the resistance memory element in its low-resistance state is $10^4$ ohms These resistances are substantially voltage-independent in the voltage range shown. As the magnitude of the voltage across the two-terminal access device increases, the dynamic resistance of the two-terminal access device rapidly decreases. As the dynamic resistance of the two-terminal access device falls relative to the resistance of the resistance memory cell in its high-resistance state, a discernible difference appears in the resistance of the resistance memory cell between the high-resistance state and the low-resistance state of the resistance memory element 328, and, hence, a corresponding difference appears in the read current. The resistance of the resistance memory cell 320 is the sum of the dynamic resistance of the two-terminal access device 326 and the resistance (high or low) of the resistance memory element 328. With a reset-polarity read voltage having a magnitude greater than about 1.0V, the resistance of the resistance memory cell 320 (and hence in the read current) differs between the high-resistance state and the low-resistance state of the resistance memory element 328. The difference can be said to be discernible when the dynamic resistance of the two-terminal access device 326 falls below the resistance of the resistance memory element 328 in its high-resistance state. In contrast, with a set-polarity read voltage within the permissible set-polarity voltage range, there is a much smaller difference, if any, in the resistance of the resistance memory cell 320 between the high-resistance state and the low-resistance state of the resistance memory element 328. The cross-hatched region 800 in FIG. 8 shows the voltage range in which the dynamic resistance of the two-terminal access device 326 is less than the resistance of the resistance memory element 328 in its high-resistance state. In this region 800, a measurable difference exists in the resistance of the resistance memory cell (and hence in the read current) between the high-resistance and low-resistance states of the resistance memory element 328.

In embodiments in which the two-terminal access device 326 is embodied as a tunnel diode, the dimensions of the thin-film metal oxide layer (119 in FIGS. 2A-2C) of the tunnel diode influence the current-voltage characteristic of the two-terminal access device. The thickness of the thin-film metal oxide layer can be optimized to maximize the useable range of the reset-polarity read voltage. In the examples described herein, the two-terminal access device 326 is embodied as a tunnel diode having a metal oxide layer having a thickness in the range from about 0.5 nm to about 1 nm.

Accordingly, in a resistance memory cell as disclosed herein, a read operation uses a read pulse at the reset polarity. A reset-polarity read pulse has an easily-usable voltage range and provides an easily-detectable read current ratio between the high-and low-resistance states of the resistance memory cell. In this manner, the read operation will rapidly and reliably read the resistance state of the resistance memory cell without inadvertently altering the resistance state of the resistance memory element. The terminology used herein to describe the structure of a memory array, e.g., word lines, bit lines, etc., is believed to be widely adopted. However, this terminology is not intended to imply a particular organization of the memory array. It should be understood that the memory array is not limited to the array configurations illustrated herein and additional array configurations can be used.

The output of a process for designing an integrated circuit, or a portion of an integrated circuit, having one or more of the resistance memory cells described herein may be stored in a computer-readable medium, such as, but not limited to, a magnetic tape, optical disk, magnetic disk, semiconductor memory, or the like. The computer-readable medium may be encoded with data structures or other information describing circuitry that may be physically instantiated as an integrated circuit or a portion of an integrated circuit. Although various formats may be used for such encoding, these data structures are commonly written in Caltech Intermediate Format (CIF), Calma GDS II Stream Format (GDSII), or Electronic Design Interchange Format (EDIF). Such data structures can be developed from schematic diagrams of the type described above and can be encoded the data structures on the computer-readable medium. Such encoded data can be used to fabricate integrated circuits comprising one or more of the resistance memory cells described herein.

Resistance memory cells and memory cells are described herein in detail using illustrative embodiments. However, the appended claims are not limited to the precise embodiments described.

We claim:

1. A resistance memory, comprising:
a conductive-bridging resistance memory cell, comprising:
a conductive-bridging resistance memory element having an asymmetric current-voltage characteristic; and
a two-terminal access device connected in series with the resistance memory element, the two-terminal access device configured to enable a bi-directional flow of current through the resistance memory element in response to application of a voltage greater than a threshold voltage; and
a circuit to apply across the resistance memory cell a set voltage pulse having a set polarity to set the resistance memory cell to a low-resistance state that is retained after application of the set voltage pulse, a reset voltage pulse having a reset polarity, opposite to the set polarity, to reset the resistance memory cell to a high-resistance state that is retained after application of the reset voltage pules, wherein the reset voltage pulse exhibits a magnitude that is larger than a magnitude of the set voltage pulse, the circuit to apply a read voltage pulse of the reset polarity and smaller in magnitude than the reset voltage pulse to determine the resistance state of the resistance memory cell without changing the resistance state of the resistance memory cell.

2. The resistance memory of claim 1 wherein, in response to the application of the read voltage pulse having the reset polarity to the resistance memory cell, the two-terminal access device has a dynamic resistance less than the resistance of the resistance memory element in the high-resistance state.

3. The resistance memory of claim 1, wherein the two-terminal access device comprises a symmetrical non-linear conductance element.

4. The resistance memory of claim 1, wherein the conductive-bridging resistance memory cell comprises solid electrolyte material.

5. The resistance memory of claim 1, wherein the conductive-bridging resistance memory cell comprises back-to-back diodes connected in parallel.

6. The resistance memory of claim 1, wherein the conductive-bridging resistance memory cell is one of an array of conductive-bridging resistance memory cells having an active electrode, an inert electrode, and an electrode layer between the active electrode and the inert electrode.

7. The resistance memory of claim 6, wherein the two-terminal access device comprises a symmetrical non-linear conductance element.

8. The resistance memory of claim 6, wherein the two-terminal access device comprises a tunnel diode.

9. The resistance memory of claim 6, wherein the two-terminal access device comprises back-to-back diodes connected in parallel.

10. The resistance memory of claim 2, wherein the read voltage pulse is of a voltage that produces across the two-terminal access device a voltage sufficient to reduce the dynamic resistance of the two-terminal access device to less than the resistance of the conductive-bridging resistance memory element in the high-resistance state.

11. A resistance memory cell, comprising:
a conductive-bridging resistance memory element having an asymmetric current-voltage characteristic, the conductive-bridging resistance memory element comprising:
an inert electrode,
an active electrode, and
an electrolyte layer between the active electrode and the inert electrode; and
a two-terminal access device adjacent one of the inert electrode and the active electrode, but not between the electrolyte layer and the active electrode;
wherein:
application of a set voltage pulse having a first magnitude and a set polarity to the resistance memory cell sets the resistance memory cell to a low-resistance state that is retained after application of the set voltage pulse, and application of a reset voltage pulse having a second magnitude and a reset polarity to the resistance memory cell resets the resistance memory cell to a high-resistance state that is retained after application of the reset voltage pulse, the set polarity being opposite to the reset polarity, the second magnitude being larger than the first magnitude; and
application of a read voltage pulse of the reset polarity determines the resistance state of the resistance memory cell.

12. The resistance memory cell of claim 11, wherein the read voltage pulse of the reset polarity is of a voltage that produces across the two-terminal access device a voltage sufficient to reduce a dynamic resistance of the two-terminal access device to less than a resistance of the conductive-bridging resistance memory element in the high-resistance state.

13. The resistance memory cell of claim 11, additionally comprising an internal electrode between the active electrode and the two-terminal access device.

14. The resistance memory cell of claim 11, wherein:
the two-terminal access device is configured to enable a bi-directional flow of current through the resistance memory cell in response to application of a voltage greater than a threshold voltage;
application of the read voltage pulse of the reset polarity produces a read current having a larger read current ratio between the low-resistance state and the high-resistance state than application of a read voltage pulse of the set polarity; and the read pulse of the reset polarity is smaller in magnitude than the reset pulse.

15. The resistance memory cell of claim 11, wherein the two-terminal access device comprises a symmetrical non-linear conductance element.

16. The resistance memory cell of claim 11, wherein the two-terminal access device comprises a tunnel diode.

17. A method for reading a resistance memory cell, the method comprising:

providing a resistance memory cell comprising a two-terminal access device and a conductive-bridging resistance memory element connected in series, the resistance memory cell exhibiting an asymmetric current-voltage characteristic and switchable from a high-resistance state to a low-resistance state by application thereto of a set voltage pulse having a set polarity, and switchable from the low-resistance state to the high-resistance state by application thereto of a reset voltage pulse having a reset polarity, the set polarity being opposite the reset polarity, the reset voltage pulse exhibiting a magnitude that is larger than a magnitude of the set voltage pulse the two-terminal access device enabling bi-directional flow of current through the resistance memory cell in response to application of a voltage greater than a threshold voltage; and applying to the resistance memory cell a read voltage pulse of the reset polarity to read the resistance state of the resistance memory cell, wherein the read voltage pulse is of a voltage that produces across the two-terminal access device a voltage sufficient to reduce a dynamic resistance of the two-terminal access device to less than a resistance of the conductive-bridging resistance memory element in the high-resistance state.

18. The method of claim 17, wherein the applying the read voltage pulse of the reset polarity produces a read current having a larger read current ratio between the low-resistance state and the high-resistance state than applying a read voltage pulse having the set polarity.

19. The method of claim 17, wherein the read voltage pulse of the reset polarity is smaller in magnitude than the reset voltage pulse.

20. The method of claim 17, wherein the read voltage pulse of the reset polarity is of a voltage within a range of voltages that provide a read current ratio greater than 100 between the low-resistance state and the high-resistance state of the resistance memory cell.

* * * * *